(12) United States Patent
Matthews et al.

(10) Patent No.: US 11,043,823 B2
(45) Date of Patent: Jun. 22, 2021

(54) SYSTEM AND METHOD FOR FACILITATING CONDITIONING AND TESTING OF RECHARGEABLE BATTERY CELLS

(71) Applicant: TESLA, INC., Palo Alto, CA (US)

(72) Inventors: Kevin Matthews, Reno, NV (US); Turner Caldwell, San Francisco, CA (US); Martin Sukup, San Francisco, CA (US)

(73) Assignee: Tesla, Inc., Palo Alto, CA (US)

( * ) Notice: Subject to any disclaimer, the term of this patent is extended or adjusted under 35 U.S.C. 154(b) by 420 days.

(21) Appl. No.: 15/946,635

(22) Filed: Apr. 5, 2018

(65) Prior Publication Data

US 2018/0294657 A1    Oct. 11, 2018

Related U.S. Application Data

(60) Provisional application No. 62/482,622, filed on Apr. 6, 2017.

(51) Int. Cl.
*H02J 7/00* (2006.01)
*G01R 1/067* (2006.01)
(Continued)

(52) U.S. Cl.
CPC ............ *H02J 7/0021* (2013.01); *G01R 1/067* (2013.01); *G01R 31/396* (2019.01); *H01M 10/049* (2013.01); *H01M 10/0525* (2013.01); *H01M 10/441* (2013.01); *H01M 10/446* (2013.01); *H01M 10/482* (2013.01); *H01M 10/613* (2015.04); *H01M 10/6551* (2015.04);
(Continued)

(58) Field of Classification Search
CPC ............ H01M 2/1016; H01M 2/1077; H01M 2/1083; H01M 2/1088; H01M 10/049; H01M 10/446; H01M 10/441; H01M 10/482; H01M 10/6552; H01M 10/6567; H01M 10/6554; H01M 10/0525; H01M 10/6551; H01M 10/613; H01M 10/615; G01R 31/396; G01R 1/067; Y02E 60/10; Y02T 10/70
USPC ......................................................... 320/103
See application file for complete search history.

(56) References Cited

U.S. PATENT DOCUMENTS 4,253,044 A * 2/1981 Smith ................... H01J 17/494
                                                315/169.2
4,322,597 A * 3/1982 Hooke ................ H01M 50/502
                                                 219/91.1
(Continued)

*Primary Examiner* — M Baye Diao
(74) *Attorney, Agent, or Firm* — Knobbe, Martens, Olson & Bear, LLP

(57) ABSTRACT

One embodiment can provide a system for conditioning rechargeable battery cells. The system can include a cell-group conditioning module. The cell-group conditioning module can include a cell interface block that includes a cell contact module and a circuit module. The circuit module can be configured to supply power to cells and can be positioned adjacent to the cell contact module. The cell-group conditioning module can further include a cell platform configured to accommodate a number of cells and an actuation mechanism coupled to the cell interface block or the cell platform and configured to reduce a distance between the cell interface block and cell platform, thereby allowing the cell contact module to establish electrical contact with the cells.

16 Claims, 13 Drawing Sheets

(51) Int. Cl.
*H01M 10/44* (2006.01)
*H01M 10/48* (2006.01)
*H01M 10/6552* (2014.01)
*H01M 10/6567* (2014.01)
*H01M 10/6554* (2014.01)
*H01M 10/0525* (2010.01)
*H01M 10/6551* (2014.01)
*H01M 10/613* (2014.01)
*G01R 31/396* (2019.01)
*H01M 10/04* (2006.01)
*H01M 50/20* (2021.01)
*H01M 10/615* (2014.01)

(52) U.S. Cl.
CPC ... *H01M 10/6552* (2015.04); *H01M 10/6554* (2015.04); *H01M 10/6567* (2015.04); *H01M 50/20* (2021.01); *H01M 10/615* (2015.04); Y02E 60/10 (2013.01); Y02T 10/70 (2013.01)

(56) References Cited

U.S. PATENT DOCUMENTS

| | | | | |
|---|---|---|---|---|
| 4,330,834 A * | 5/1982 | Murphy | G09G 5/30 | 345/469.1 |
| RE30,985 E * | 6/1982 | Cartaya | A01N 1/021 | 435/406 |
| 4,352,948 A * | 10/1982 | Kaplow | H01L 31/035281 | 136/246 |
| 4,359,075 A * | 11/1982 | Eberle | B65B 39/00 | 141/177 |
| 4,368,423 A * | 1/1983 | Liburdy | G01N 27/92 | 324/692 |
| 4,407,945 A * | 10/1983 | Gillis | C07K 14/55 | 435/449 |
| 4,411,990 A * | 10/1983 | Salmon | G01N 33/5011 | 435/29 |
| 4,448,879 A * | 5/1984 | Fabricius | A61K 35/14 | 424/85.2 |
| 4,451,587 A * | 5/1984 | Keshi | C08G 18/5006 | 521/129 |
| 4,458,531 A * | 7/1984 | Mehlhardt | G01N 21/76 | 250/361 C |
| 4,465,897 A * | 8/1984 | Albrecht | H02G 3/283 | 174/489 |
| 4,467,274 A * | 8/1984 | Bushman | G01V 3/082 | 324/348 |
| 4,472,506 A * | 9/1984 | Liburdy | G01N 27/92 | 205/777.5 |
| 4,473,642 A * | 9/1984 | Gillis | C12P 21/00 | 424/85.2 |
| 4,486,517 A * | 12/1984 | Bender | H01M 10/0413 | 429/149 |
| 4,493,909 A * | 1/1985 | Haas | C07C 235/08 | 521/118 |
| 4,501,815 A * | 2/1985 | Reid | C12N 5/0068 | 435/273 |
| 4,514,499 A * | 4/1985 | Noll | C12M 23/06 | 435/293.1 |
| 4,581,187 A * | 4/1986 | Sullivan | B29D 35/122 | 249/112 |
| 4,590,181 A * | 5/1986 | McCarthy | A61K 39/39 | 424/204.1 |
| 4,627,178 A * | 12/1986 | Sullivan | B29D 35/122 | 12/146 BR |
| 4,816,249 A * | 3/1989 | Levy | A61K 39/395 | 424/131.1 |
| 4,816,747 A * | 3/1989 | Bushman | G01V 3/082 | 324/71.1 |
| 4,886,604 A * | 12/1989 | Sleytr | B01D 67/0088 | 210/653 |
| 4,910,886 A * | 3/1990 | Sullivan | A43B 7/28 | 36/43 |
| 4,921,801 A * | 5/1990 | Rao | C12N 15/76 | 435/252.33 |
| 4,962,347 A * | 10/1990 | Burroughs | H01M 10/48 | 320/114 |
| 4,998,284 A * | 3/1991 | Bacus | G01N 15/1468 | 348/176 |
| 5,023,189 A * | 6/1991 | Bartlow | H01L 23/52 | 257/E23.141 |
| 5,180,809 A * | 1/1993 | Ruoslahti | C07K 14/70546 | 424/450 |
| 5,213,979 A * | 5/1993 | First | C12N 5/0604 | 435/373 |
| 5,217,170 A * | 6/1993 | Reier | B01J 8/1836 | 164/5 |
| 5,217,715 A * | 6/1993 | Krivan | A61K 31/70 | 435/252.1 |
| 5,240,606 A * | 8/1993 | Lapidus | G01N 1/2813 | 210/232 |
| 5,240,854 A * | 8/1993 | Berry | C12M 23/34 | 435/294.1 |
| 5,252,409 A * | 10/1993 | Akagi | H01M 8/2483 | 429/456 |
| 5,272,158 A * | 12/1993 | Hartman | C07D 401/14 | 514/323 |
| 5,281,585 A * | 1/1994 | Duggan | C07D 401/14 | 514/79 |
| 5,283,058 A * | 2/1994 | Faustman | A61P 3/10 | 424/152.1 |
| 5,283,194 A * | 2/1994 | Schmukler | C12M 35/02 | 435/173.6 |
| 5,321,034 A * | 6/1994 | Duggan | C07D 401/12 | 514/323 |
| 5,326,691 A * | 7/1994 | Hozier | C12N 15/1079 | 435/30 |
| 5,330,509 A * | 7/1994 | Kroll | A61N 1/3956 | 607/14 |
| 5,348,878 A * | 9/1994 | Rock | C12N 5/163 | 435/29 |
| 5,354,738 A * | 10/1994 | Tjoeng | C07C 275/24 | 514/13.7 |
| 5,386,027 A * | 1/1995 | Krivan | G01N 33/56911 | 536/123.1 |
| 5,389,521 A * | 2/1995 | Krivan | G01N 33/56911 | 435/7.33 |
| 5,408,463 A * | 4/1995 | Merchant | H04L 12/5601 | 370/218 |
| 5,410,170 A * | 4/1995 | Bulucea | H01L 29/0696 | 257/332 |
| 5,412,123 A * | 5/1995 | Rao | C09B 6/00 | 552/209 |
| 5,416,099 A * | 5/1995 | Hartman | C07D 401/14 | 514/323 |
| 5,417,972 A * | 5/1995 | Bhat | C07K 16/28 | 424/137.1 |
| 5,425,049 A * | 6/1995 | Dent | H04B 1/713 | 370/330 |
| 5,428,818 A * | 6/1995 | Meidan | H04W 36/06 | 455/436 |
| 5,453,272 A * | 9/1995 | Heerze | A61P 11/00 | 424/190.1 |
| 5,476,783 A * | 12/1995 | Mutsakis | C12M 25/02 | 435/289.1 |
| 5,480,642 A * | 1/1996 | McCarthy | A61K 39/39 | 424/278.1 |
| 5,481,533 A * | 1/1996 | Honig | H04B 7/2618 | 370/335 |
| 5,484,892 A * | 1/1996 | Tedder | C07K 14/70503 | 435/328 |
| 5,489,594 A * | 2/1996 | Bovy | A61P 7/02 | 514/256 |
| 5,507,034 A * | 4/1996 | Bodin | H04W 72/06 | 455/452.2 |
| 5,523,980 A * | 6/1996 | Sakui | G11C 16/0483 | 365/230.08 |
| 5,537,434 A * | 7/1996 | Persson | H04B 1/7156 | 375/134 |

(56) References Cited

U.S. PATENT DOCUMENTS

| | | | | |
|---|---|---|---|---|
| 5,552,303 A | * | 9/1996 | Grabstein | C07K 14/5443 435/320.1 |
| 5,558,956 A | * | 9/1996 | Gujer | H01M 50/20 429/99 |
| 5,559,718 A | * | 9/1996 | Baisuck | G06F 30/398 716/52 |
| 5,563,060 A | * | 10/1996 | Hozier | C12N 15/1079 435/252.33 |
| 5,565,321 A | * | 10/1996 | Spriggs | A01K 67/0276 435/6.16 |
| 5,565,361 A | * | 10/1996 | Mutsakis | C12M 25/02 435/289.1 |
| 5,574,138 A | * | 11/1996 | Grabstein | A61K 38/1709 424/85.2 |
| 5,591,829 A | * | 1/1997 | Matsushita | C07K 16/1063 530/388.35 |
| 5,593,676 A | * | 1/1997 | Bhat | C07K 16/28 424/130.1 |
| 5,602,305 A | * | 2/1997 | Pober | A01K 67/0271 424/9.2 |
| 5,622,933 A | * | 4/1997 | Sabatier | A61P 31/12 514/3.8 |
| 5,629,412 A | * | 5/1997 | Glinskii | A61K 31/70 530/322 |
| 5,638,294 A | * | 6/1997 | Sasada | G06F 30/33 716/114 |
| 5,643,759 A | * | 7/1997 | Pfreundschuh | C07K 16/283 435/70.21 |
| 5,649,292 A | * | 7/1997 | Doner | H04W 16/02 455/447 |
| 5,656,441 A | * | 8/1997 | Faller | G01N 33/5005 435/29 |
| 5,663,051 A | * | 9/1997 | Vlasselaer | G01N 33/491 435/7.23 |
| 5,671,221 A | * | 9/1997 | Yang | H04B 1/7115 370/320 |
| 5,678,187 A | * | 10/1997 | Meidan | H04W 36/20 455/439 |
| 5,694,262 A | * | 12/1997 | Takata | G11B 19/04 360/53 |
| 5,707,616 A | * | 1/1998 | Grabstein | A61K 38/1709 424/85.2 |
| 5,723,130 A | * | 3/1998 | Hancock | A61K 39/39 424/211.1 |
| 5,728,580 A | * | 3/1998 | Shuler | C12N 5/0601 435/348 |
| 5,736,143 A | * | 4/1998 | Heerze | A61P 1/00 424/190.1 |
| 5,745,486 A | * | 4/1998 | Beshai | H04L 12/5601 370/380 |
| 5,747,040 A | * | 5/1998 | Heerze | A61P 29/00 424/190.1 |
| 5,764,581 A | * | 6/1998 | Nix | G11C 11/404 365/189.15 |
| 5,764,641 A | * | 6/1998 | Lin | H04Q 11/0478 370/412 |
| 5,783,216 A | * | 7/1998 | Faustman | A61K 35/22 424/578 |
| 5,809,401 A | * | 9/1998 | Meidan | H04W 36/06 455/63.3 |
| 5,817,516 A | * | 10/1998 | Kehry | C07K 14/54 435/377 |
| 5,817,750 A | * | 10/1998 | Ruoslahti | C07K 14/70546 530/317 |
| 5,830,702 A | * | 11/1998 | Portnoy | C07K 14/005 435/69.3 |
| 5,831,142 A | * | 11/1998 | Tedder | A01K 67/0278 800/11 |
| 5,833,990 A | * | 11/1998 | Heerze | A61P 37/00 424/185.1 |
| 5,837,084 A | * | 11/1998 | Barss | B31D 3/0207 156/197 |
| 5,855,619 A | * | 1/1999 | Caplan | A61L 27/3834 623/23.72 |
| 5,856,363 A | * | 1/1999 | Tatarintsev | A61K 31/145 514/707 |
| 5,863,954 A | * | 1/1999 | Tatarintsev | A61K 31/00 514/707 |
| 5,863,955 A | * | 1/1999 | Tatarintsev | A61K 36/8962 514/707 |
| 5,864,024 A | * | 1/1999 | Glinskii | C07H 7/02 536/18.7 |
| 5,866,931 A | * | 2/1999 | Bulucea | H01L 29/0696 257/331 |
| 5,871,969 A | * | 2/1999 | Hastings | C07K 14/47 435/69.1 |
| 5,892,001 A | * | 4/1999 | Grabstein | A61K 38/1709 530/387.9 |
| 5,894,212 A | * | 4/1999 | Balogh | H02J 7/0026 320/122 |
| 5,894,565 A | * | 4/1999 | Furtek | H03K 19/17736 326/38 |
| 5,901,354 A | * | 5/1999 | Menich | H04W 36/18 455/442 |
| 5,907,171 A | * | 5/1999 | Santin | H01L 27/11526 257/315 |
| 5,914,609 A | * | 6/1999 | Curry | H02J 7/0045 324/601 |
| 5,948,821 A | * | 9/1999 | Tatarintsev | A61K 31/00 514/707 |
| 5,955,275 A | * | 9/1999 | Kamb | C12Q 1/6897 435/6.12 |
| 5,955,572 A | * | 9/1999 | Ruoslahti | C07K 14/70546 530/317 |
| 5,981,602 A | * | 11/1999 | Tatarintsev | A61K 36/8962 514/707 |
| 5,985,262 A | * | 11/1999 | Grabstein | A61K 38/1709 424/184.1 |
| 5,989,807 A | * | 11/1999 | West | A61K 31/70 435/15 |
| 5,998,184 A | * | 12/1999 | Shi | C12M 23/08 435/176 |
| 6,004,759 A | * | 12/1999 | Johnson | C07K 14/62 435/7.21 |
| 6,004,812 A | * | 12/1999 | Scadden | A61K 35/17 435/347 |
| 6,013,495 A | * | 1/2000 | Schwartz | C07K 14/7055 435/173.1 |
| 6,014,509 A | * | 1/2000 | Furtek | H03K 19/1735 326/41 |
| 6,022,540 A | * | 2/2000 | Bruder | C07K 16/2803 424/133.1 |
| 6,022,697 A | * | 2/2000 | Kaufman | G01N 33/564 435/7.24 |
| 6,026,227 A | * | 2/2000 | Furtek | H03K 19/1735 326/40 |
| 6,038,166 A | * | 3/2000 | Wong | G11C 11/5621 365/185.03 |
| 6,047,247 A | * | 4/2000 | Iwanishi | G06F 11/008 702/117 |
| 6,091,954 A | * | 7/2000 | Haartsen | H04M 15/00 455/447 |
| 6,094,584 A | * | 7/2000 | Khanna | H04W 16/10 455/452.2 |
| 6,106,832 A | * | 8/2000 | Spriggs | A01K 67/0276 424/134.1 |
| 6,108,238 A | * | 8/2000 | Nakamura | G11C 16/3454 365/185.22 |
| 6,110,897 A | * | 8/2000 | Unverzagt | C07H 7/027 514/25 |
| 6,114,129 A | * | 9/2000 | Agrawal | G01N 33/56972 424/130.1 |
| 6,137,787 A | * | 10/2000 | Chawla | H04W 16/02 370/337 |
| 6,156,878 A | * | 12/2000 | Godfrey | A61P 31/00 530/350 |

(56) References Cited

U.S. PATENT DOCUMENTS

| | | | | |
|---|---|---|---|---|
| 6,167,559 A * | 12/2000 | Furtek | ................ | H03K 19/1735 326/41 |
| 6,184,359 B1 * | 2/2001 | Grabstein | .......... | A61K 38/1709 424/130.1 |
| 6,198,743 B1 * | 3/2001 | Giroux | ................ | H04L 12/5602 370/235.1 |
| 6,206,839 B1 * | 3/2001 | Zwelling-Aamot | ........................ | A61B 10/0291 600/572 |
| 6,207,159 B1 * | 3/2001 | Kaufman | ........... | G01N 33/6854 424/184.1 |
| 6,210,959 B1 * | 4/2001 | Lodri | ................... | C12M 23/08 210/296 |
| 6,221,665 B1 * | 4/2001 | Jaroszeski | ............. | C12M 35/02 435/285.2 |
| 6,232,088 B1 * | 5/2001 | Franklin | ................. | C12N 9/00 435/18 |
| 6,235,526 B1 * | 5/2001 | Sedlacek | ................ | C12N 15/85 435/325 |
| 6,242,566 B1 * | 6/2001 | Godfrey | ................... | A61P 1/00 530/350 |
| 6,245,522 B1 * | 6/2001 | Rearden | ........... | G01N 33/57415 435/4 |
| 6,245,883 B1 * | 6/2001 | Heerze | ................ | C07K 14/235 530/300 |
| 7,786,699 B2 * | 8/2010 | Demers | ................ | H02J 7/0026 320/133 |
| 7,859,220 B2 * | 12/2010 | Bushong | ........... | H02J 7/007192 320/107 |
| 8,013,571 B2 * | 9/2011 | Agassi | .................... | B60L 50/51 320/109 |
| 8,120,315 B2 * | 2/2012 | Stone | ................. | H01M 50/267 320/107 |
| 8,906,541 B2 * | 12/2014 | Faass | ................ | H01M 10/6557 429/148 |
| 9,209,440 B2 * | 12/2015 | Callicoat | ............. | H01M 50/572 |
| 9,438,047 B2 * | 9/2016 | Thoren | ............... | H01M 10/482 |
| 9,553,343 B2 * | 1/2017 | Malcolm | ............ | H01M 10/482 |
| 9,577,227 B2 * | 2/2017 | Sumpf | ................ | H01M 50/213 |
| 9,893,385 B1 * | 2/2018 | Nayar | ................ | H01M 10/486 |
| 9,911,951 B2 * | 3/2018 | DeKeuster | ........ | H01M 10/0525 |
| 2007/0105214 A1 * | 5/2007 | Micklash, II | ........ | G01N 35/028 435/306.1 |
| 2017/0222207 A1 * | 8/2017 | Pezdek | ............... | H01M 50/256 |

\* cited by examiner

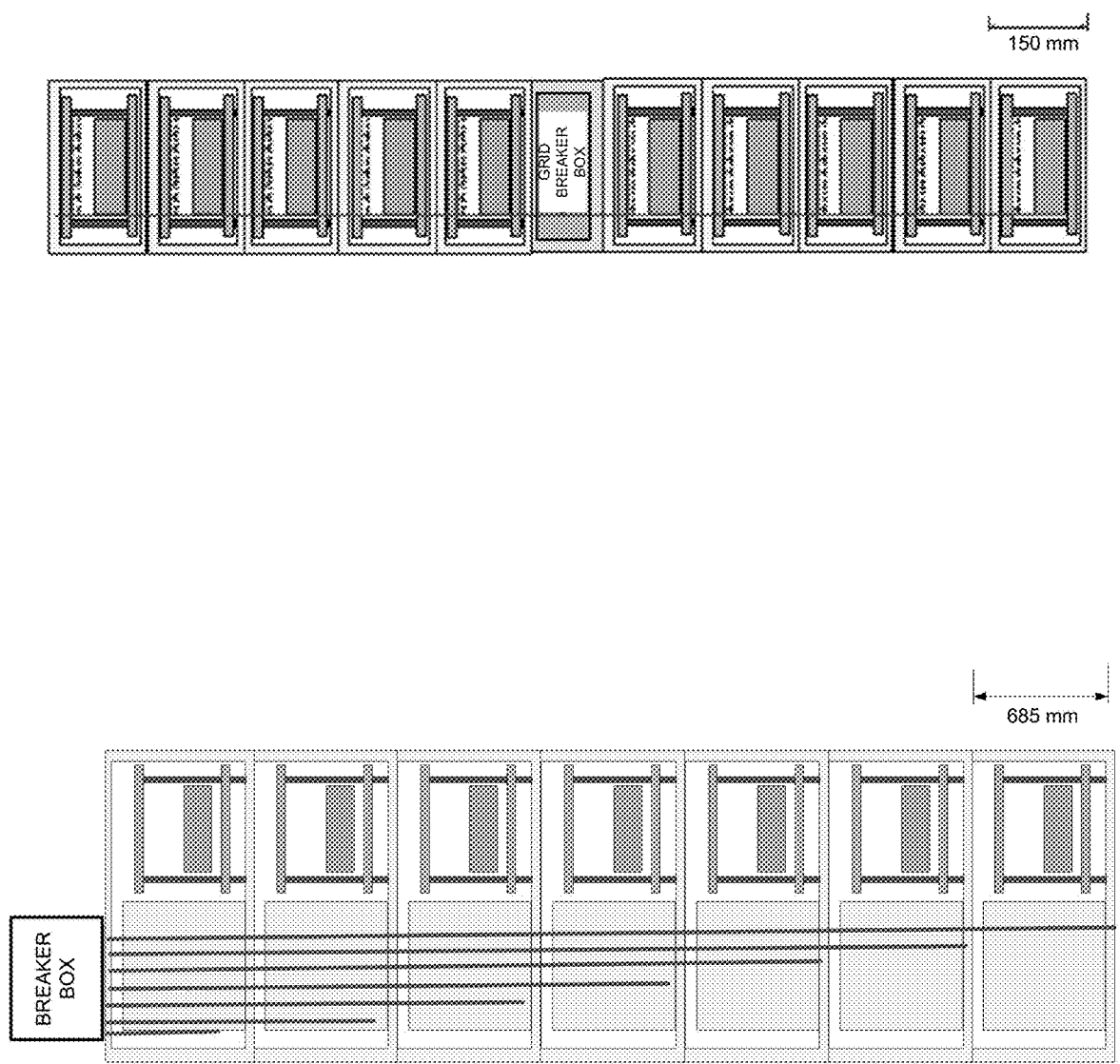

SYSTEM AND METHOD FOR FACILITATING CONDITIONING AND TESTING OF RECHARGEABLE BATTERY CELLS

RELATED APPLICATIONS

This claims the benefit of U.S. Provisional Application No. 62/482,622, entitled "SYSTEM AND METHOD FOR FACILITATING CONDITIONING AND TESTING OF RECHARGEABLE BATTERY CELLS," by inventors Kevin Matthews, Turner Caldwell, and Martine Sukup, filed 6 Apr. 2017.

BACKGROUND

Field

This disclosure is generally related to the fabrication of rechargeable battery cells. More specifically, this disclosure is related to the post-assembly formation, conditioning, and testing process of rechargeable battery cells.

Related Art

Rechargeable batteries, especially Li-ion based batteries, are now being used in a wide range of electrical appliances, devices, and vehicles. A critical step in the manufacturing of Li-ion cells is the formation process. Typically, after a cell is assembled, the cell undergoes at least one precisely controlled charge/discharge cycle to activate the working materials, transforming them into their useable form. Also, this charge/discharge process can help identify cells that do not meet the quality standard before they are placed in a battery pack. Instead of the normal constant-current, constant-voltage charging curve, this special charging process begins with a low current, which builds up gradually. This is called the "formation process." The formation process can result in the creation of a solid-electrolyte-interface (SEI) layer on the anode, which serves as a passivation layer essential for moderating the charging process under normal use.

Furthermore, during the formation process, information on cell performance, such as open-circuit voltage (OCV), direct-current resistance (DCR), capacitance, and impedance, can be collected for quality analysis. The spread of the performance measurements can also indicate whether the formation process and the upstream cell manufacturing process are under control.

SUMMARY

One embodiment can provide a system for conditioning rechargeable battery cells. The system can include a cell-group conditioning module. The cell-group conditioning module can include a cell interface block that includes a cell contact module and a circuit module. The circuit module can be configured to supply power to cells and can be positioned adjacent to the cell contact module. The cell-group conditioning module can further include a cell platform configured to accommodate a number of cells and an actuation mechanism coupled to the cell interface block or the cell platform and configured to reduce a distance between the cell interface block and cell platform, thereby allowing the cell contact module to establish electrical contact with the cells.

In a variation on this embodiment, the cell contact module can include a number of receptacles, and a respective receptacle can include a number of probes configured to establish positive and negative contacts with a corresponding cell on a same end of the cell.

In a further variation, at least one of the probes is a Kelvin probe configured to provide two separate contact points with the cell.

In a further variation, a respective receptacle can include an edge with an angled surface, thereby forming a converging cup for cell alignment.

In a variation on this embodiment, the system can further include a number of cell-group conditioning modules electrically coupled in series and configured to divide a direct current (DC) voltage.

In a variation on this embodiment, the system can further include a heat dissipating mechanism coupled to the circuit module.

In a further variation, the heat dissipating mechanism can include a heat pipe attached to the circuit module coupled a cold plate, which is attached to a liquid cooling system.

In a variation on this embodiment, the system can further include an additional number of cell-group conditioning modules. A first cell-group conditioning module can be configured to discharge a first group of cells while a second cell-group conditioning module is charging a second group of cells, and energy released by the first group of cells can be used to charge the second group of cells.

In a variation on this embodiment, the circuit module can include power supply and measurement circuitry for each cell being conditioned.

One embodiment can provide a method for conditioning rechargeable battery cells. The method can include receiving a first group of cells, loading the first group of cells onto a platform, activating an actuation mechanism coupled to a cell interface block to establish electrical contact between the cells and the cell interface block, and performing charging and discharging cycles to the cells.

One embodiment can provide a delivery system for conditioning rechargeable battery cells. The system can include one or more cell-group conditioning container, each container configured to accommodate multiple cells grouped together; one or more staging areas configured to store the containers prior to conditioning the cells; a cell interface block that includes a cell contact module and a circuit module, the circuit module being configured to supply power to cells and is positioned adjacent to the cell contact module; a cell platform configured to accommodate the cells during conditioning; and a crane configured to transport the cell-group conditioning containers from the staging areas to the cell platform and further configured to create an electrical contact between the cells in the conditioning container and the cell contact module.

One embodiment can provide system for conditioning rechargeable battery cells. The system can include a plurality of racks, each containing a plurality of cell-group conditioning modules; and a robot configured to move battery cells into and out of the cell-group conditioning modules absent of human intervention. A space between two racks can be reduced to a distance that does not allow a human to enter into the space.

One embodiment can provide a system for conditioning rechargeable battery cells. The system can include a cooling tunnel configured to thermally treat a number of cells so that the cells reach a predetermined internal temperature before undergoing a formation process.

"Cell" or "battery cell" generally refers to an electrochemical cell, which is a device capable of generating electrical energy from chemical reactions or facilitating chemical reactions through the introduction of electrical energy. A battery can contain one or more cells.

"Rechargeable battery" generally refers a type of electrical battery which can be charged, discharged into a load, and recharged a number of times. In this disclosure, a number of examples are described based on Li-ion rechargeable batteries. Nevertheless, embodiments of the present invention are not limited to one type of rechargeable battery, and can be applied in conjunction with various rechargeable battery technologies.

BRIEF DESCRIPTION OF THE FIGURES

The patent or application file contains at least one drawing executed in color. Copies of this patent or patent application publication with color drawing(s) will be provided by the Office upon request and payment of the necessary fee.

FIG. 10 shows the space savings of the cell formation system, according to one embodiment of the present invention.

In the figures, like reference numerals refer to the same figure elements.

DETAILED DESCRIPTION

Figure 1A:
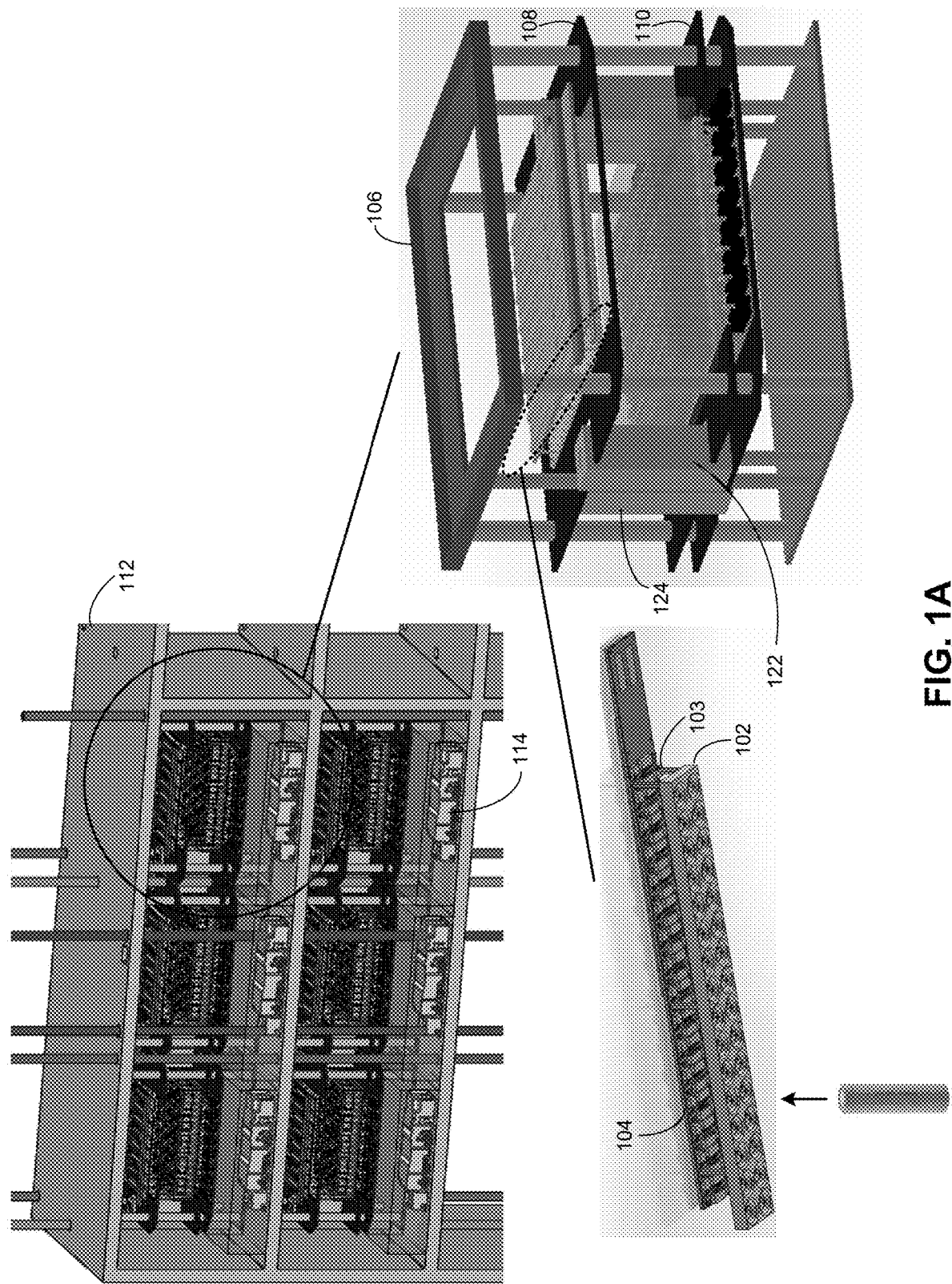
FIG. 1A shows an exemplary configuration of an electrical circuit module and a contact module for cell formation, according to one embodiment of the present invention.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention can solve the technical problem of performing the post-assembly formation, conditioning, and testing process on rechargeable cells in a space- and energy-efficient, and scalable way, which can in turn reduce the cost of manufacturing rechargeable cells.

For high throughput manufacturing, a large number of cells can be placed in the formation process together, typically in a conveyance tray. Conventional high-volume formation facilities typically consist of power supply and control modules coupled to battery contact fixtures, which hold the tray of cells and facilitate electrical connection to the individually controlled cells. Such systems often require a large number of cables (typically four or more wires per battery cell), take up a significant amount of space, and can be energy inefficient. As a result, the inefficiency from the power electronics and long cables can result in heat rejection to the room, which often requires large ducted air cooling systems and could lead to variations in the cell temperature, thereby increasing the chance of error in the formation process. In addition, the existing formation facilities are typically designed without full consideration and optimization of the support systems.

In particular, the existing designs and configurations leave much room for improvement in high-volume manufacturing. In addition, many existing cell-formation systems are not taking full advantage of the rapid advances in power conversion technology. In general, the existing formation systems often exhibit the following characteristics:
  (1) Large physical footprint;
  (2) Low-efficiency and costly power electronics;
  (3) Overly complex clamping fixture;
  (4) Large amount of cabling that wastes energy, is costly, and reduces measurement accuracy;
  (5) Uses air cooling to transfer heat generated by inefficient power usage, which in turn consumes power to remove heat, takes up space, and is difficult to control without significant thermal gradients, which results in cell-to-cell variation.

The concepts, designs, and configurations described herein make improvements in the following areas:
  (1) Reduce capital expenditure (CAPEX) of the equipment and supporting facility infrastructure;
  (2) Improve energy efficiency;
  (3) Reduce thermal gradients in the room to reduce cell-to-cell temperature-based performance variation;
  (4) Increase volumetric density of the testers, which results in a number of cost savings in building and support systems;
  (5) Capture the waste heat at an elevated temperature, which allows the dissipated thermal energy to be used for different, useful purposes;
  (6) Facilitate hot-swappable components, thereby improving equipment utilization; and
  (7) Reduce fire risk.

Embodiments of the present invention can solve the aforementioned problems by providing significant space saving, improved energy efficiency, more effective heat dissipation, and capability to accommodate more effective automation systems. In particular, a new design of the electrical circuit unit closely coupled with the contact board can accommodate a large number of cells undergoing the formation process in a densely packed manner. A hybrid cooling system that combines air and liquid cooling can dissipate heat more effectively. Furthermore, an intelligent formation control system that stages the charge/discharge cycles among different cell groups can significantly reduce the power consumption and required power conversion capacity of the entire formation system.

System Architecture

FIG. 1A shows an exemplary configuration of an electrical circuit module and a contact module for cell formation, according to one embodiment of the present invention. In this example, contact module 102 and electrical circuit module 104 are positioned adjacent to each other. A cell undergoing formation charge/discharge cycling can be placed in contact with the contact pins in one of the receptacles on contact module 102. Circuit module 104 can accommodate a number of electrical circuits, each corresponding to a receptacle on contact module 102 for accommodating a cell. Each cell-specific circuit can be configured to supply well-controlled voltage to the cell housed in the receptacle, and collect measurements for the cell. Note that this compact configuration of contact module 102 and circuit module 104, which jointly form a cell interface block, can eliminate the need for a large amount of cabling, as is the case in a conventional formation system. A large amount of cabling can be expensive, take up space, require long installation/repair time, can be a source of inefficiency, and can lead to less accuracy.

Note that since contact module 102 can contain multiple pogo pins in the receptacle, contact module 102 can also be referred to as a "pogo board." In one embodiment, contact module 102 and circuit module 104 can be attached together with spacers 103, so that the two modules can form one rigid entity. In addition, contact module 102 can provide 32 receptacles to accommodate 32 cells at once. Other numbers of receptacles are also possible.

To facilitate scalable and automatic operation, the contact-module/circuit-module combination can be attached to a top platform 108, and the cells undergoing formation can be held on a bottom platform 110. Both top platform 108 and bottom platform 110 can be housed in a frame 106. In one embodiment, top platform 108 and bottom platform 110 can be actuated to move vertically in a "clamshell" manner. Specifically, actuator 122 can move bottom platform 110 upward, and actuator 124 can move top platform downward. Frame 106 can therefore be referred to as a "clamshell structure." After cells are placed on bottom platform 110, top platform 108 and bottom platform 110 can be actuated to move toward each other, so that the top of the cells can be in contact with the pins positioned inside each receptacle in the cell contact module (similar to contact module 102). It is also possible to fix the vertical position of bottom platform 110 and only move top platform 108 downward to contact the cells, or vice versa. Note that this one-sided actuation configuration has certain advantages. It can eliminate the complexity in the clamping fixture by using only one set of actuation mechanism and can reduce the overall space required for the clamping fixture by approximately one third. Furthermore, the top-only cell connection configuration can eliminate cables to the bottom of the cells, which also results in the aforementioned benefits. The contact and circuit modules also help eliminate the need for a separate power electronics module and long cable runs. In the example shown in FIG. 1A, clamshell structure 106 can accommodate eight cell interface blocks (each containing a contact module and a circuit module), wherein each block can accommodate 32 cells. Therefore, the entire clamshell structure can process 32×8=256 cells simultaneously. Other numbers of cells per block and numbers of blocks are also possible. Such dense packing of the cells can lower the per-cell operational efficiency (operational expenditure, OPEX) and total CAPEX, which would not be attainable in a conventional formation system where the contact board and the power supply and control modules are separate from each other, which requires complex and space-consuming cabling to connect the two.

To further improve the cell-packing density, a number of clamshell structures, such as structure 106, can be housed in a larger rack, such as rack 112. In this example rack 112 can accommodate six clamshell structures, bringing the total number of cells undergoing formation to 1536. Other numbers of clamshell structures are also possible. Note that bulky electrical components, such as system control and AC/DC power conversion module 114, can be provisioned on a per-clamshell-structure basis and be placed in the vicinity of each clamshell structure. In further embodiments, the AC/DC power conversion module can be provisioned in a centralized manner on a per-rack basis. More details are provided below in conjunction with FIG. 10.

Figure 1B:
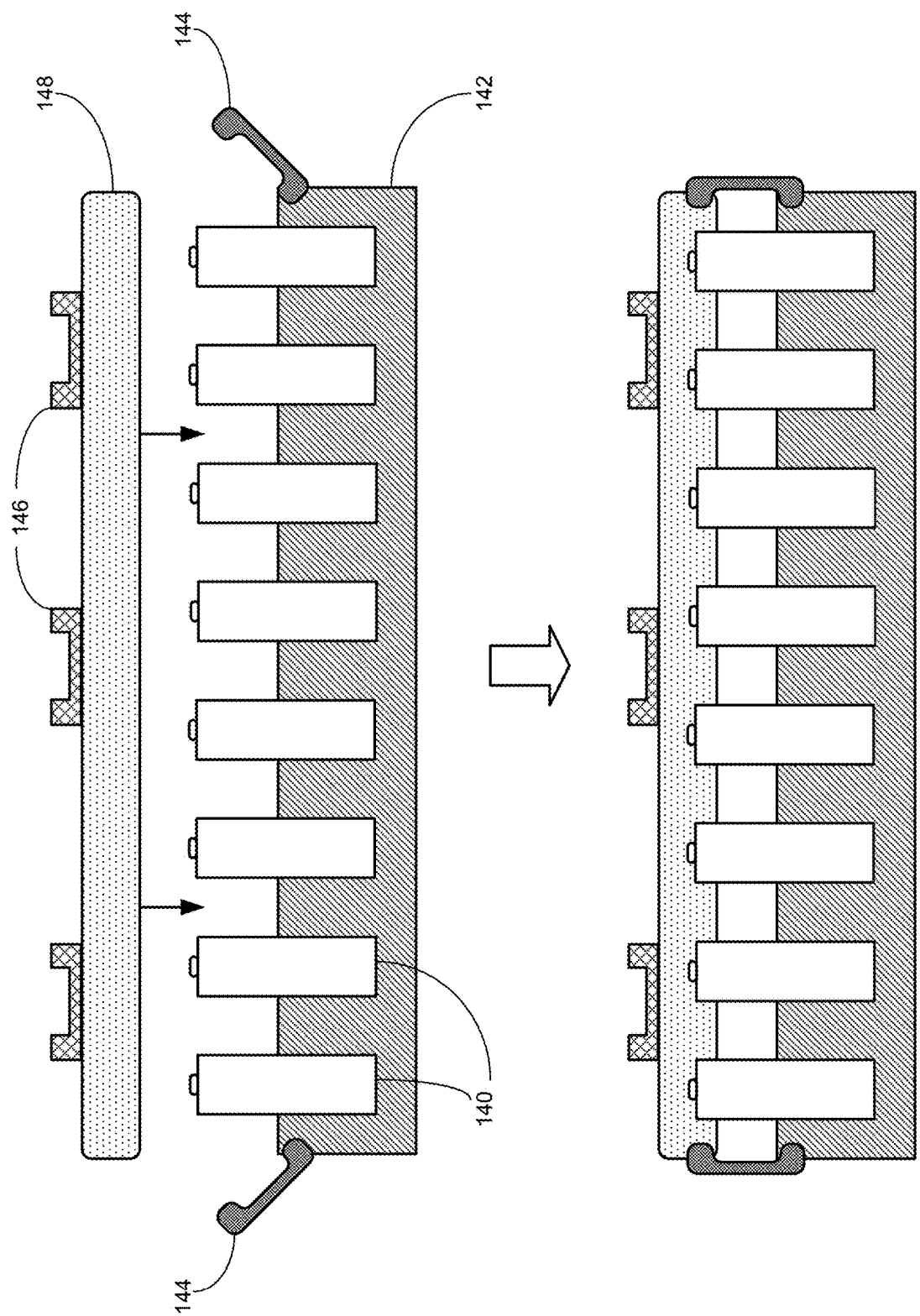
FIG. 1B shows an exemplary actuator-free clamping fixture, according to one embodiment of the present invention.

It is possible to further simplify the clamshell structure by eliminating the actuation mechanisms. Instead, a robotic system can be used to attach an electric connection top tray to a conveyance tray carrying the cells. The robotic system can then slide the entire fixture into a rack. FIG. 1B shows an exemplary actuator-free clamping fixture, according to one embodiment of the present invention. In this example, a number of cells 140 can be carried by conveyance tray 142 (actually number of cells not shown). Conveyance tray 142 can have a number of receptacles for accommodating the cells and be used to transport the cells to and away from the rack. Electrical connection tray 148 can contain built-in circuitry and spring-loaded connectors for connecting to the top of cells 140. A robotic system, which can be part of a crane that transports conveyance tray 142, can lower electrical connection tray 148 and mate cells 140 to the corresponding formation circuitry. Clamps 144 can be used to secure the mating position and ensure reliable contact between electrical connection tray 148 and cells 140. In addition, electrical connection rails 146 can be positioned on electrical connection tray 148. These rails can be used to establish an electrical connection between electrical connection tray 148 and the connectors on the rack, which provide the power and other circuitry connection for the formation process. Note that rails 146 can also be used for guiding the robotic system for sliding the entire clamping fixture into a slot on a rack, optionally with blind-mate busbars. Furthermore, as described in conjunction with FIG. 3 below, the clamping fixture can also be mated to a thermal interface such as a blind coolant connector or plate with a low thermal resistance. Note that the actuator-free design of the clamping fixture shown in FIG. 1B can achieve even greater spatial density by eliminating actuators on every unit.

Figure 2:
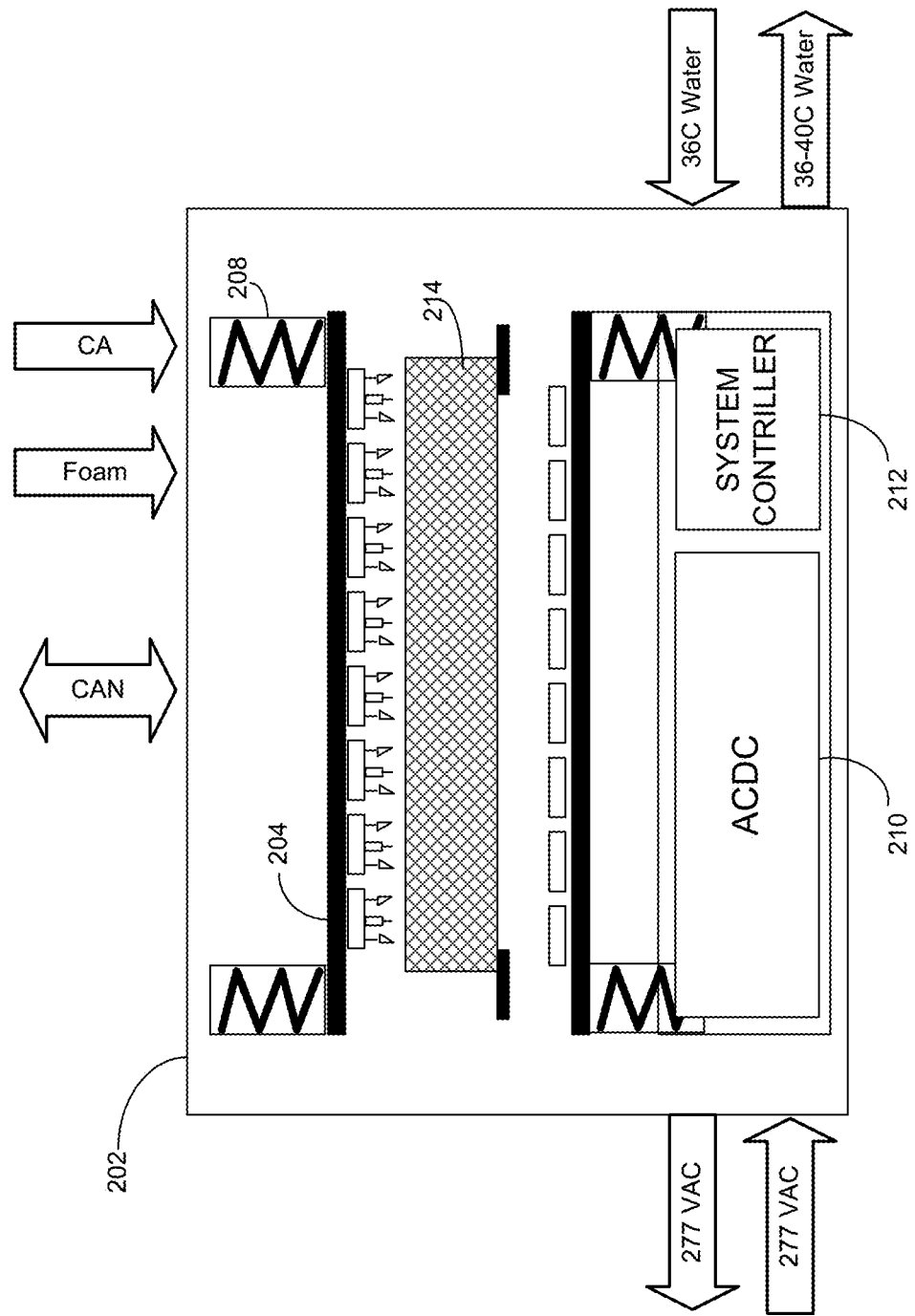
FIG. 2 shows a block diagram for an exemplary clamshell structure, according to one embodiment of the present invention.

FIG. 2 shows a block diagram for an exemplary clamshell structure, according to one embodiment of the present invention. In this example, clamshell structure 202 includes a cell interface block 204, which is similar to the combined modules 102 and 103 in FIG. 1. Cell interface block 204 can have a number of receptacles, each configured to establish secure electrical contacts with a cell. In one embodiment, each receptacle can have a center probe and one or more outer probes. The center probe can be a Kelvin probe that contains more than one contact, which can form a Kelvin bridge with the outer probes for precise measurement of the cell.

Cell interface block 204 can be actuated by actuator 208 to move downward and be in contact with a number of cells 214. Optionally, the platform that supports cells 214 can also be actuated to move upward. Also included in clamshell structure 202, or placed in the vicinity of clamshell structure 202, are AC/DC power supply unit 210 and system controller 212. AC/DC power supply unit 210 can convert high-voltage AC power to a low-voltage DC power, which can subsequently be controlled and distributed to the cells based on a predetermined cell formation, conditioning, and measurement process. In addition, a liquid coolant circulation path can be provided to clamshell structure 202. As explained in more detail below, liquid-cooled heat sinks can be coupled to cell interface block 204 and/or the platform supporting cells 214. In one embodiment, an inlet pipe can supply coolant at approximately 36° C. to clamshell structure 202, and an outlet pipe can remove the outgoing coolant. Running the coolant at this temperature, as opposed to a much lower temperature, allows the recovered heat to be used for other processes such as building heating, which further mitigates the overall costs of the formation process. In one embodiment, a configuration that combines the use of heat pipe and cooling plate can be applied in conjunction with the cell interface modules. In addition, a second cooling system can be used to control the temperature of the AC/DC power unit. In this second cooling system, the manifolded components can function both as a structural support as well as a cooling plate or a heat sink for immersion cooling. With immersion cooling, in one embodiment, the AC/DC power unit can slide, using for example busbar-blind connections, into a dielectric coolant fluid, which can be pumped to a centralized heat exchanger.

Figure 3:
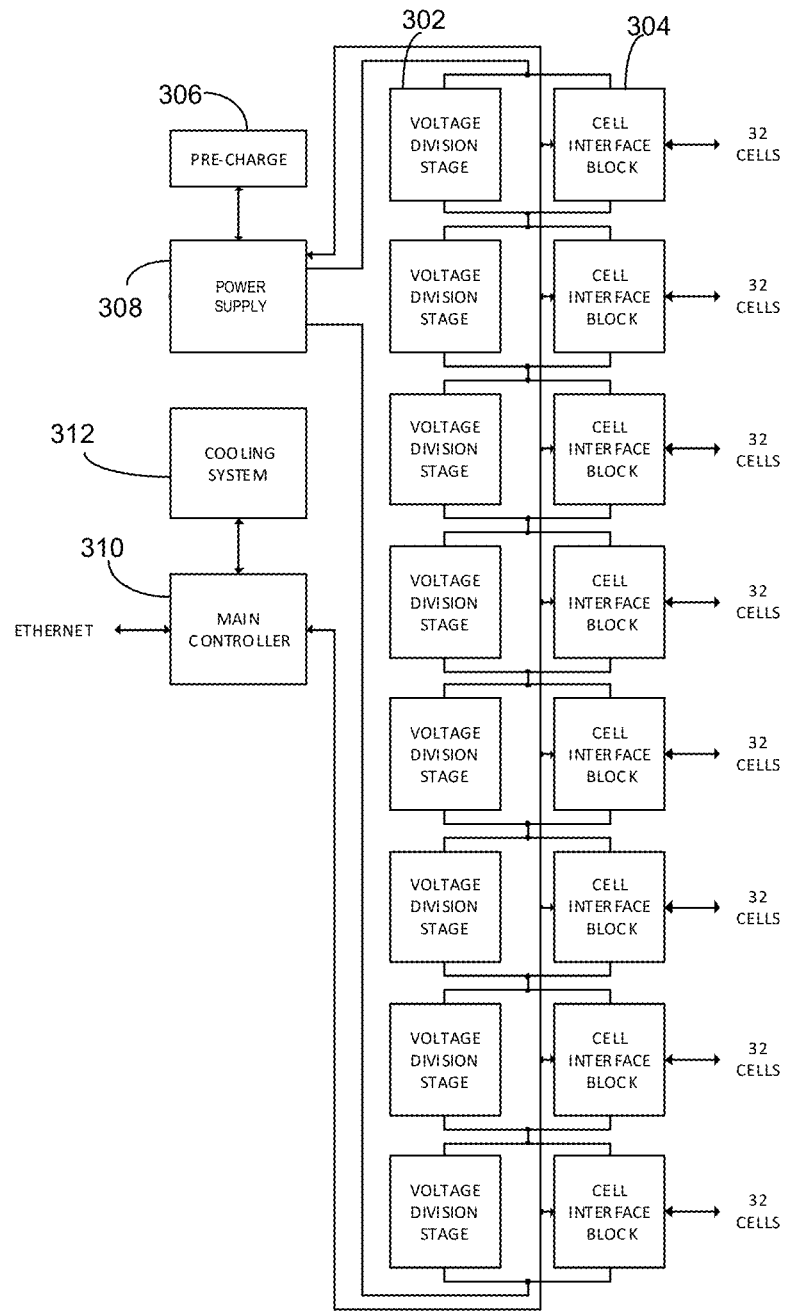
FIG. 3 shows a block diagram of an exemplary power-supply and control configuration for a clamshell structure, according to one embodiment of the present invention.

FIG. 3 shows a block diagram of an exemplary power-supply and control configuration for a clamshell structure, according to one embodiment of the present invention. In this example, it is assumed that eight cell interface blocks, such as cell interface block 304 capable of accommodating 32 cells, are housed in one clamshell structure. Each cell interface block is coupled to a corresponding voltage division stage, which can control the DC power supplied to the corresponding cell interface block. The eight combinations of voltage division stage and cell interface block can be connected in series to divide a DC voltage supplied to the entire train of eight blocks. This in-series connection has a significant advantage over existing designs in that the majority of the power does not need to be processed in a DC-DC voltage conversion stage. As a result, this configuration can reduce inefficiency because less current is processed and converted, and can therefore help reduce the amount of total required power conversion capacity. In contrast, conventional formation systems typically have cell interface blocks connected in parallel, which requires additional DC voltage conversion.

In one embodiment, approximately 50V DC is provided by power supply unit 308 to the eight cell interface blocks connected in series. A pre-charge control unit 306 can be coupled to power supply unit 308 and regulate the output DC voltage during a pre-charge stage when the cells undergo an off-gassing process to be prepared for the subsequent SEI layer formation. Main controller unit 310 can be in communication with each cell interface block and control the timing and charging voltage supplied to the cells in each cell interface block. Main controller unit 310 can also communicate with cooling system 312, which can include a liquid cooling mechanism, and control the environment temperature.

Figure 4:
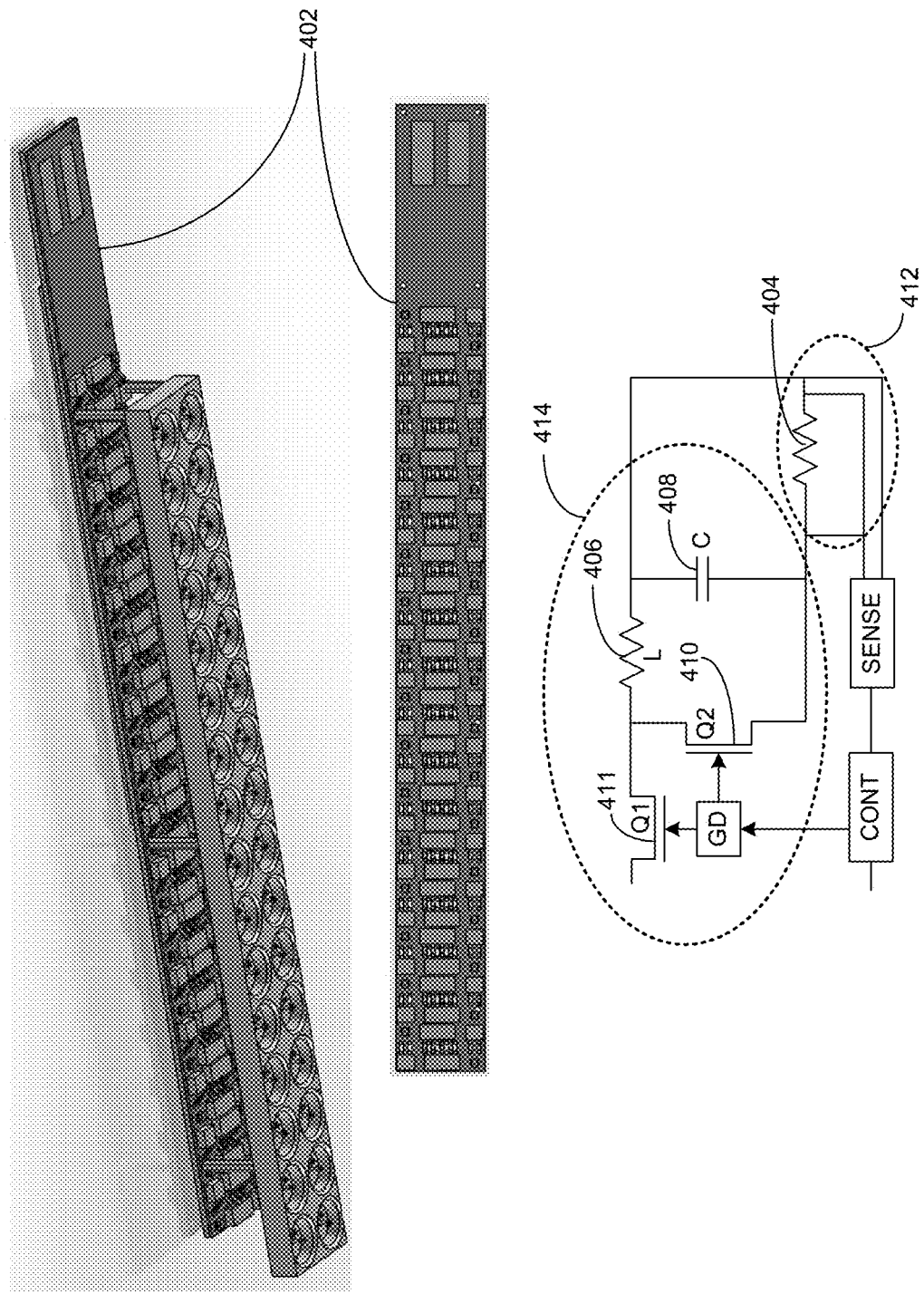
FIG. 4 shows an exemplary DC-DC conversion and cell measurement circuit, according to one embodiment of the present invention.

FIG. 4 shows an exemplary DC-DC conversion and cell measurement circuit, according to one embodiment of the present invention. In this example, circuit module 402, which is part of a cell interface block, has 32 sets of circuit for DC-DC conversion and cell measurement. A respective circuit can include a Kelvin bridge circuit 412 for a cell 404. A Kelvin bridge circuit typically includes a first pair of contacts, referred to as "force contacts," to supply power (typically a current) to a device; and a second pair of contacts, referred to as "sensing contacts," for taking measurement over the device. Here, the power supply portion of Kelvin bridge 412 includes a step-down DC-DC conversion circuit 414, which includes a pair of gates 411 and 410, inductor 406, and capacitor 408. Gates 411 and 410 work jointly as a switch and rectifier, while inductor 406 and capacitor 408 function as an energy storage element. By controlling the switch duty cycle, one can control the voltage applied to cell 404.

FIGS. 5A-5E show various configurations of contacts in a cell receptacle, according to embodiments of the present invention. In the example shown in FIG. 5A, each receptacle can have a center Kelvin probe 502, which can connect to the cathode/positive contact of the cell, and an outer Kelvin probe 504, which can connect to the anode/negative contact of the cell. Each Kelvin probe provides two separate contact points, thereby facilitating a Kelvin bridge connection with the cell. Furthermore, the edge of each receptacle, such as edge 506, can be shaped with a ramp and function as a converging cup to help the cell be aligned with the receptacle.

Figure 5B:
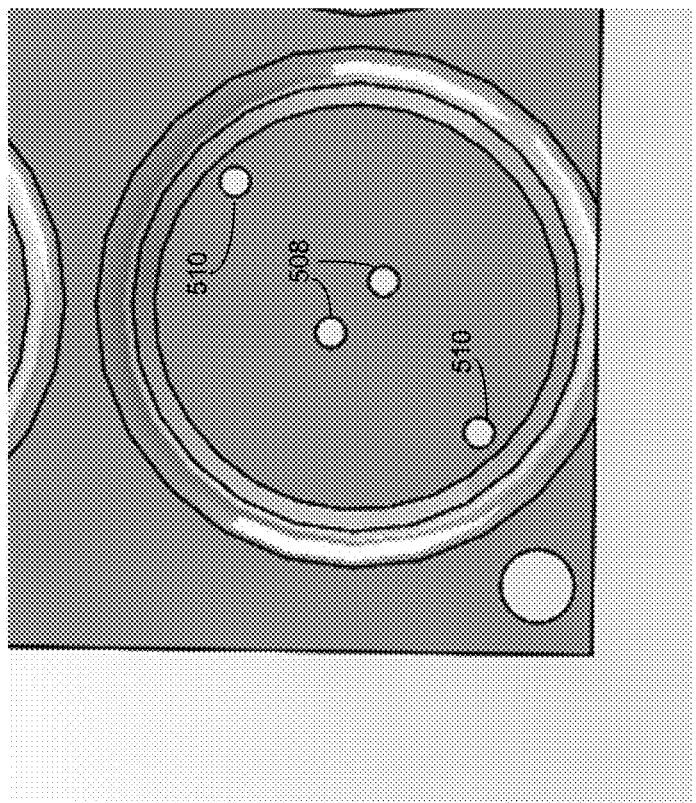
FIGS. 5A-5E show various configurations of contacts in a cell receptacle, according to embodiments of the present invention.
Figure 5A:
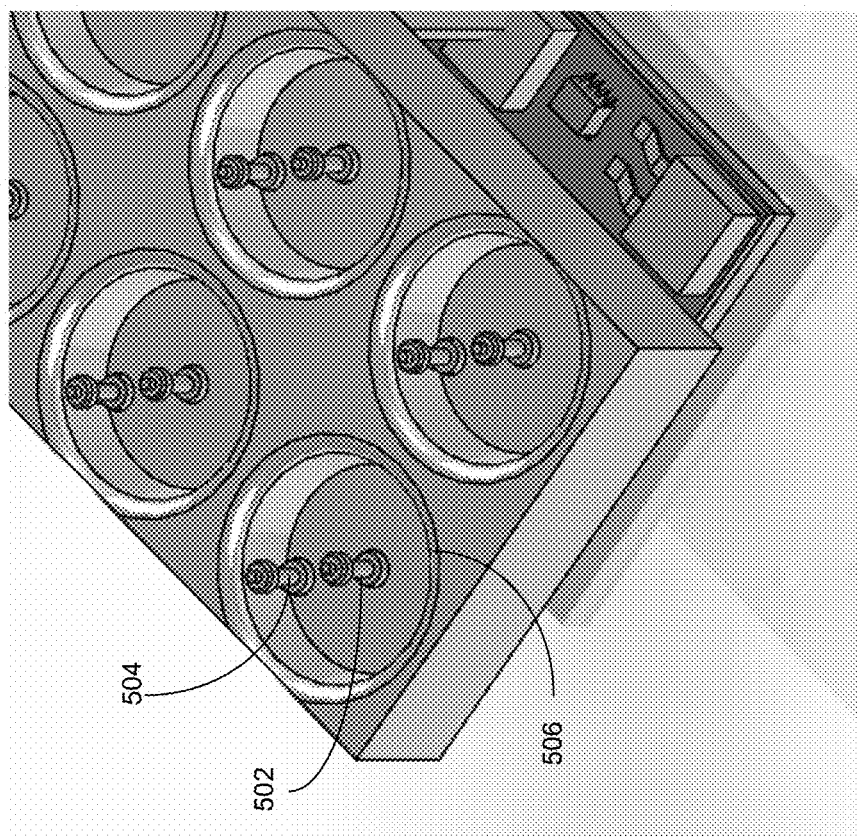

In the example shown in FIG. 5B, two center single probes 508 can be positioned near the center of the receptacle to provide two separate contact points to the cell's cathode/positive contact as part of the Kelvin bridge connection. Two out single probes 510 can be positioned near the outer edge of the receptacle to provide two separate contact points to the cell's anode/negative contact. Similarly, the receptacle's outer edge can be shaped with a ramp as a converging cup to help with cell alignment.

Figure 5D:
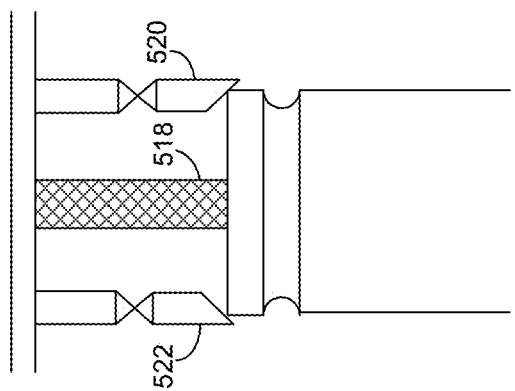
Figure 5C:
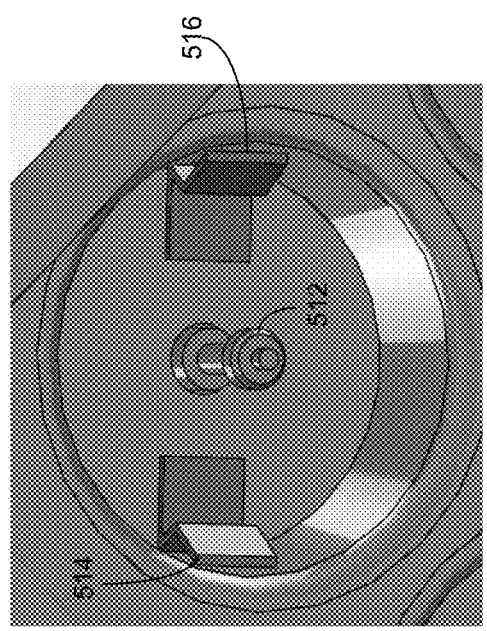

FIG. 5C shows another configuration, where each receptacle includes a center Kelvin probe 512 providing two separate contacts, and two outer spring tabs 514 and 516. Spring tabs 514 and 516 can be shaped to provide a guiding ramp to help with cell alignment. Optionally, the edge of the receptacle can be shaped as a converging cup for cell alignment, and the spring tabs can be positioned inside the converging cup.

In the example shown in FIG. 5D, a center Kelvin probe 518 provides two separate contact points to the cell's cathode/positive contact point. Two individual outer probes 520 and 522, each being a single point of contact provide connection to the cell's anode/negative contact point. Note that the outer probes can have angled tips, which can serve as guiding ramps to help with cell alignment.

Figure 5E:
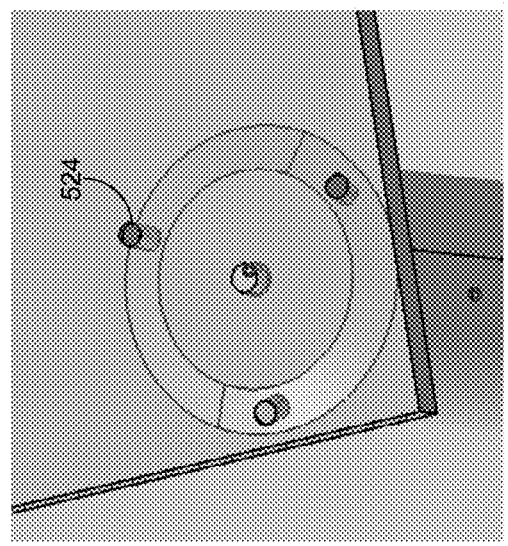
Figure 5E:
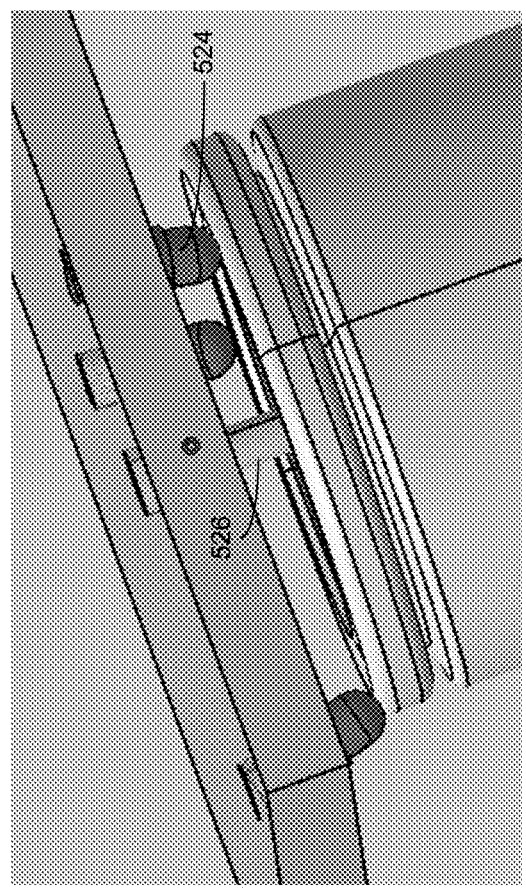

In the example shown in FIG. 5E, a number (such as 3 or 5) of small circular tipped probes 524 can be placed near the receptacle shoulder to provide contact with the cell's anode/negative contact point. These probes can be tilted toward the center to guide the cell for accurate alignment. In addition, a center Kelvin probe 526 can provide two separate contacts, and can optionally have serrations to cut through the passivation layer on the aluminum cathode/positive contact point of the cell. The left drawing of FIG. 5E shows the perspective view, whereas the right drawing of FIG. 5E shows the top view of the receptacle.

Figure 6:
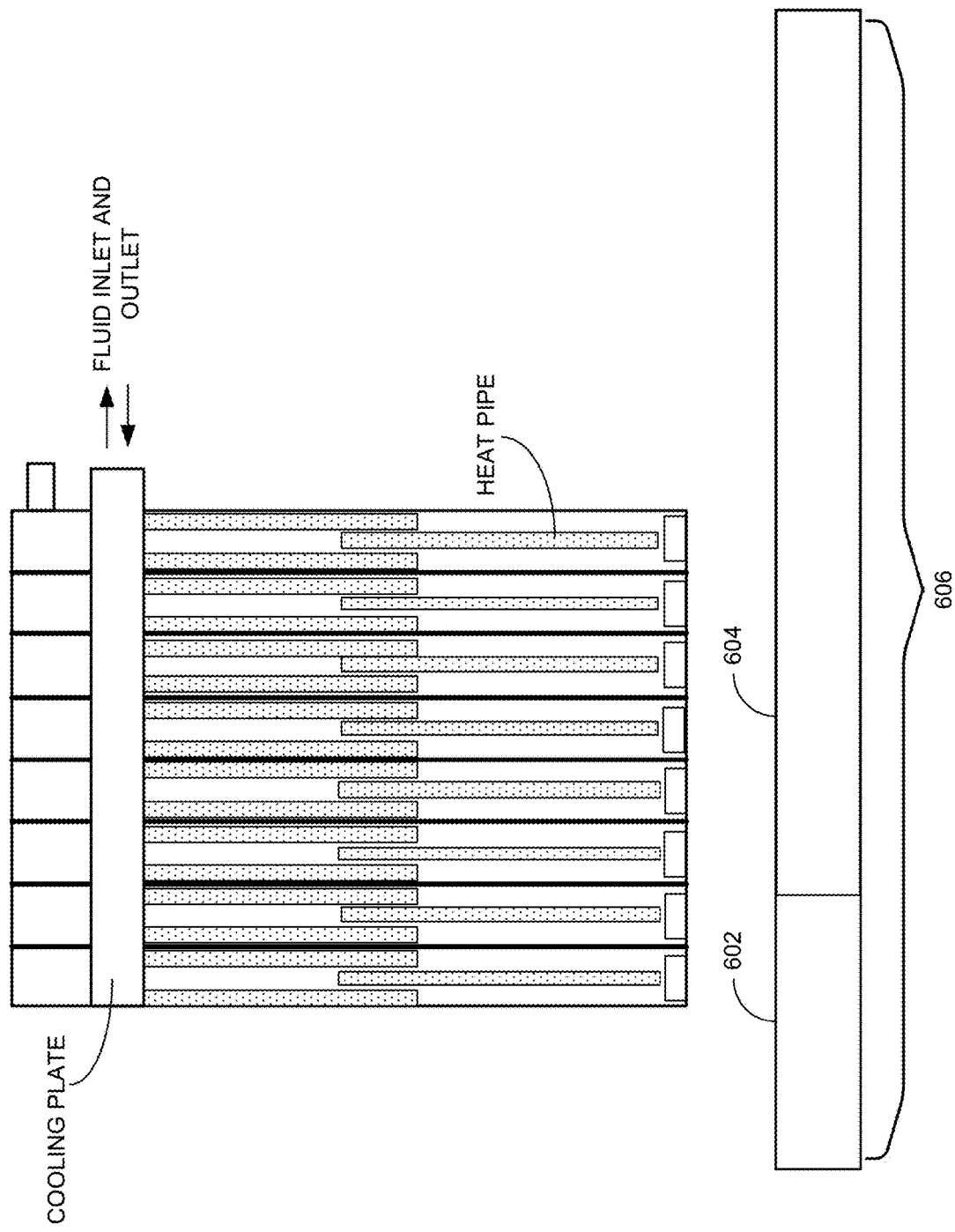
FIG. 6 shows an exemplary heating dissipating mechanism for the formation system, according to one embodiment of the present invention.

In one embodiment, each cell interface block can be coupled to a heat dissipating mechanism, which allows the formation system to operate under a controlled temperature. FIG. 6 shows an exemplary heating dissipating mechanism for the formation system, according to one embodiment of the present invention. In this example, each of the eight cell interface blocks in a clamshell structure can be coupled to a heat dissipating mechanism 606. Heat dissipating mechanism 606 can include a cold plate 602 and a heat pipe 604. The bottom drawing of FIG. 6 shows the conceptual configuration of the heat dissipating mechanism, and the top drawing of FIG. 6 shows the physical configuration of the heat dissipating mechanism having eight heat pipes coupled to a cooling plate.

Heat pipes can be closed systems that typically include a sealed hollow tube with one end thermally coupled to a colder region away from the heat source. For example, one of the heat pipes may be thermally coupled to a cold plate that can removes heat from the heat pipe. The inside walls of the heat pipe may be lined with a capillary structure. When heat is applied to the heat pipe, the liquid in the capillary structure can absorb heat though a phase change, which causes the liquid to evaporate and become a gas. The gas can migrate to the colder end of the heat pipe where it then condenses and becomes liquid again. As the vapor condenses, heat is removed from the system. The capillary structure may then migrate the liquid back through the length of the heat pipe.

Heat pipe 604 can be attached to the circuit module board of the corresponding cell interface block and transfer heat away from the circuits. Heat pipe 604 is attached to cold plate 602, which is liquid-cooled. The cold plates of the eight heat dissipating devices, each coupled to one of the eight cell interface blocks, can be attached to a common liquid coolant pathway. This configuration allows for use of liquid cooling without requiring a large number of liquid-tight connections. In certain embodiments, instead of using heat pipe 604, one or more cooling tubes may be used. Cooling tubes can be open systems, which could introduce a potential failure point for the system over a closed heat-pipe system. In addition, cooling plates and tubes typically have more coolant interface points, which can increase the probability of leaks compared with a heat pipe. Heat pipes also make the system more modular for quick repair. For example, instead of disconnecting a fluid line connection, one can perform a face plate compression operation from a screw or spring-loaded clamp to replace a heat pipe.

Figure 7:
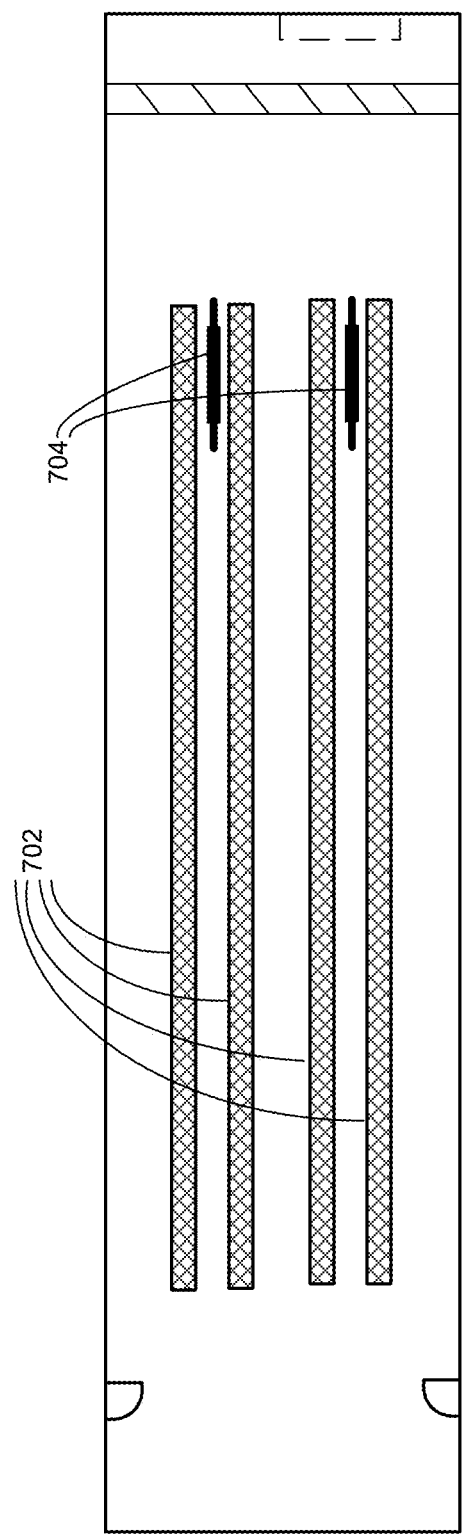
FIG. 7 shows the simplified floor plan of a building that houses a number of racks, according to one embodiment of the present invention.

The cell-formation system design described above can be installed in a room with high space efficiency, due to the compact design of the clamshell structure and the rack shelf to house the clamshell structures. As shown in FIG. 7, a number of rack shelves 702, as the one shown in FIG. 1A, can be placed in close proximity with one another. In one embodiment, these shelves can be placed on tracks and be moved as needed like book shelves in a library. Furthermore, an automated crane or robotic system (such as cranes 704) can be used to maneuver trays of cells without human intervention (e.g., loading and unloading cells into the clamshell structures). Furthermore, referring to FIG. 1B, when actuator-free clamping fixtures are used, cranes 704 can assemble these fixtures and slide them into racks 702, which can further improve spatial density. In certain embodiments that utilize an automated crane or robot to maneuver trays of cells without human intervention, valuable floor resources may be saved by reducing the space between the shelves, such that only sufficient space for the crane is needed. Furthermore, when liquid cooling is used, the space reserved for air ducts can be freed. As a result, one can save the space reserved for traditional additional access ways or larger spacing between shelves for humans.

As part of the initial conditioning process of newly assembled cells, the cells are subject to a number of charge/discharge cycles, so that their capacity can be measured. These charge/discharge cycles can often consume a large amount of energy and generate undesirable heat. In one embodiment, to mitigate the energy consumption, the charge/discharge cycles of different groups of cells can be offset in the time domain, such that the discharge cycle of one group of cells can be used to power the charge cycle of a different group of cells.

Referring to FIG. 3, there can be eight groups of cells undergoing the charge/discharge cycles. Each group contains 32 cells, which are connected to a corresponding cell interface block. Main controller unit 310 can control the timing of each cell group's charge and discharge cycles, so that the discharge cycle of one group can be used to the charge of another group. Furthermore, a centralized room-level controller can provide general instructions on when to start a charge/discharge cycle.

Figure 8:
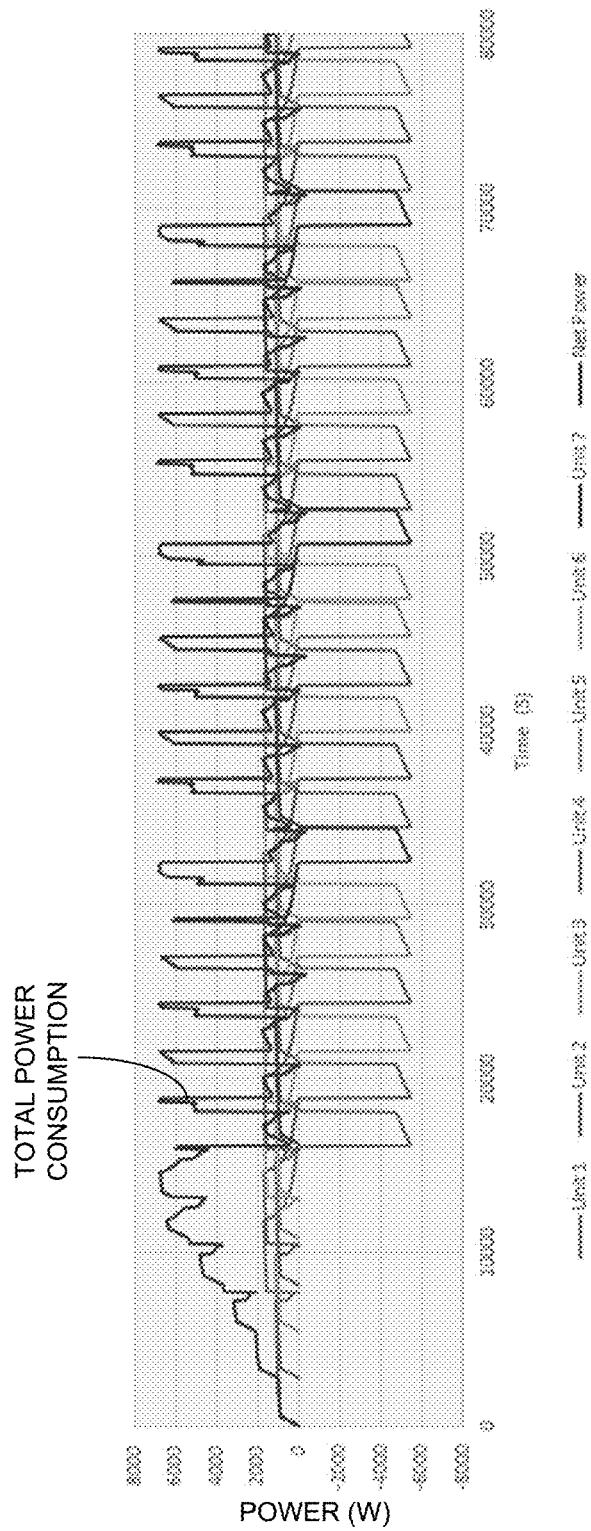
FIG. 8 shows the energy consumption of eight groups of cells, according to one embodiment of the present invention.

FIG. 8 shows the energy consumption of eight groups of cells, according to one embodiment of the present invention. As can be seen in this example, the starting time of the charge/discharge cycles for each group of cells is offset by a predetermined amount. When the power consumption is negative, it indicates that the group of cells are discharging and supplying power to other cells. As a result of the time offset between the charge/discharge cycles of different cell groups, the total power consumption of the eight groups can be significantly reduced. This configuration can also reduce the amount of required infrastructure for provisioning power. For example, instead of having cables that can carry 6 KW of power for each unit and the corresponding AC/DC and DC/DC conversion capacity, only 6 KW in total power can be sufficient. In one embodiment, the controls for the cell groups can also be centralized in the corresponding AC/DC module.

Figure 9:
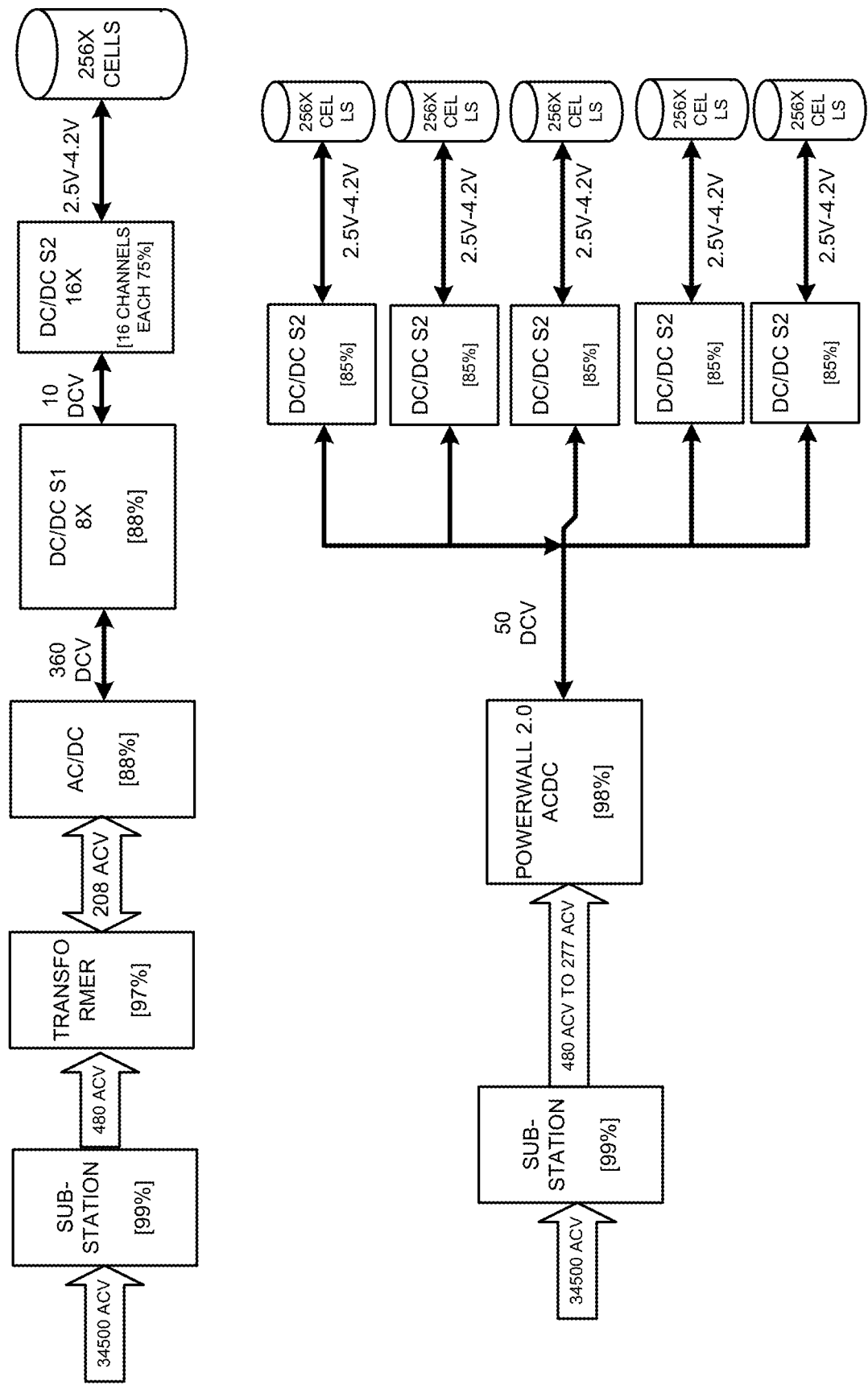
FIG. 9 shows the difference between the power supply chain in the present inventive cell formation system and a power supply chain in a conventional system, according to one embodiment of the present system.

FIG. 9 shows the difference between the power supply chain in the present inventive cell formation system and a power supply chain in a conventional system, according to one embodiment of the present system. The top portion of FIG. 9 shows a conventional power supply chain, which includes a substation and a transformer to bring a high-voltage AC power line down to a 208-V AC power supply. Subsequently, an AC/DC conversion unit converts the AC power to DC power. Two DC/DC voltage conversion units are then used to bring the DC voltage to 2.5-4.2 V to the cells.

In contrast, as shown in the lower portion of FIG. 9, embodiments of the present invention uses an AC/DC conversion unit to directly convert a 277 V AC power (after the substation and AC transformer) to a 50 V DC power. This 50 V DC power is then shared among the clamshell structures housed in a rack (see FIG. 1 and FIG. 3). Within each clamshell structure, this 50 V DC power is further divided by the voltage division stage for each cell interface block to 2.5-4.2 V for the cells.

FIG. 10 shows the space savings of the cell formation system, according to one embodiment of the present invention. On the left is a conventional cell formation system, which requires a separate power supply unit for each group of cells. The present inventive system, as shown on the right, only needs one power supply unit for a number of clamshell structures, each of which can accommodate 256 cells. Therefore, the present inventive cell formation system can provide significant space savings. Moreover, the height of each clamshell structure (e.g., about 150 mm) can be much smaller compared to height of a group of cells (e.g., about 685 mm) in the conventional systems, thus resulting in the overall space saving.

Overall, embodiments of the present invention employ a thermal strategy to reduce the heat that needs to be transferred by improving the formation system's efficiency and the use of cooling tunnels (described below). The use of liquid cooling or immersion cooling allows heat to be captured at higher temperatures, which makes it possible to use the captured energy in other parts of the building.

In a typical formation process, the temperature experienced by each cell may vary from cell to cell and from room to room. In one embodiment, the cells can be heated or cooled to a predetermined temperature, in a cooling tunnel, prior to entering the main area of the room where formation takes place. The cooling tunnel can be a continuous process in which the cells are kept on a conveyor. Heat transfer can occur with high-velocity air, radiation-based cooling plates, thermal conduction through a carrier tray, direct resistive heating, or a combination of these approaches. In order to maintain the cells at a uniform internal temperature, the cooling tunnel can apply a temperature profile. For example, initially, a more extreme temperature can be applied and then a cooling or heating process can be carried out to achieve a target cell temperature. In addition, because the cells entering the room typically need the opposite of what the cells leaving the room need, a counter-flow approach can be implemented that allows the cells entering the room to exchange heat with the cells leaving the room. That is, a cooling tunnel can be implemented to exchange heat between the cells entering the room and the cells leaving the room.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A system for conditioning rechargeable battery cells, the system comprising:
   a cell-group conditioning module, comprising:
      a cell interface block comprising a cell contact module and a circuit module, wherein the circuit module is configured to supply power to battery cells and is positioned adjacent to the cell contact module;
      a cell platform configured to accommodate a number of the battery cells; and
      an actuation mechanism coupled to the cell interface block or the cell platform and configured to reduce a distance between the cell interface block and cell platform, thereby allowing the cell contact module to establish electrical contact with the battery cells.

2. The system of claim 1, wherein the cell contact module comprises a number of receptacles; and
   wherein a respective receptacle comprises a number of probes configured to establish positive and negative contact with a corresponding cell on a same end of the cell.

3. The system of claim 2, wherein at least one of the probes is a Kelvin probe configured to provide two separate contact points with the cell.

4. The system of claim 2, wherein a respective receptacle comprises an edge with an angled surface, thereby forming a converging cup for cell alignment.

5. The system of claim 1, further comprising a number of cell-group conditioning modules electrically coupled in series and configured to divide a direct current (DC) voltage.

6. The system of claim 1, further comprising a heat dissipating mechanism coupled to the circuit module.

7. The system of claim 6, wherein the heat dissipating mechanism comprises a heat pipe attached to the circuit module coupled a cold plate, which is attached to a liquid cooling system.

8. The system of claim 1, further comprising an additional number of cell-group conditioning modules;
   wherein a first cell-group conditioning module is configured to discharge a first group of battery cells while a second cell-group conditioning module is charging a second group of battery cells; and
   wherein energy released by the first group of battery cells is used to charge the second group of battery cells.

9. The system of claim 1, wherein the circuit module comprises power supply and measurement circuitry for each battery cell being conditioned.

10. A method for conditioning rechargeable battery cells, the method comprising:
   receiving a first group of battery cells;
   loading the first group of battery cells onto a platform;
   activating an actuation mechanism coupled to a cell interface block, wherein the actuation mechanism is activated to reduce a distance between the cell interface block and the platform thereby causing establishment of electrical contact between the first group of battery cells and the cell interface block, wherein the cell interface block comprises a cell contact module and a circuit module, and wherein the circuit module is configured to supply power to the first group of battery cells; and
   performing charging and discharging cycles to the first group of battery cells.

11. The method of claim 10, further comprising:
   discharging the first group of battery cells while charging a second group of battery cells, wherein energy produced by the first group of battery cells is used to charge the second group of battery cells.

12. The method of claim 10, further comprising:
   supplying a liquid coolant to a cooling mechanism,
   wherein the cooling mechanism comprises a heat pipe and a cold plate,
   wherein the cold plate is liquid cooled, and
   wherein the heat pipe is coupled to the cell interface block.

13. A delivery system for conditioning rechargeable battery cells, the system comprising:
   one or more cell-group conditioning container, each cell-group conditioning container configured to accommodate multiple battery cells grouped together;
   one or more staging areas configured to store the cell-group conditioning containers prior to conditioning the battery cells;
   a cell interface block comprising a cell contact module and a circuit module, wherein the circuit module is configured to supply power to the battery cells and is positioned adjacent to the cell contact module;
   a cell platform configured to accommodate the battery cells during conditioning; and
   a crane configured to transport the cell-group conditioning containers from the staging areas to the cell platform and further configured to create an electrical contact between the battery cells in the cell-group conditioning container and the cell contact module.

14. The delivery system of claim 13, wherein the cell contact module includes rails configured to establish the electrical contact.

15. The delivery system of claim 14, wherein the crane is configured to guide the one or more cell-group conditioning containers to a rack via respective rails.

16. The delivery system of claim 13, wherein clamps of the cell-group conditioning container are configured to mate with the cell contact module.

* * * * *